United States Patent
Puura et al.

(10) Patent No.: US 10,174,614 B2
(45) Date of Patent: Jan. 8, 2019

(54) MINE VEHICLE AND METHOD OF INITIATING MINE WORK TASK

(71) Applicant: SANDVIK MINING AND CONSTRUCTION OY, Tampere (FI)

(72) Inventors: Jussi Puura, Tampere (FI); Tomi Von Essen, Tampere (FI)

(73) Assignee: SANDVIK MINING AND CONSTRUCTION OY, Tampere (FI)

( * ) Notice: Subject to any disclaimer, the term of this patent is extended or adjusted under 35 U.S.C. 154(b) by 219 days.

(21) Appl. No.: 15/111,297

(22) PCT Filed: Jan. 14, 2015

(86) PCT No.: PCT/EP2015/050565
§ 371 (c)(1),
(2) Date: Jul. 13, 2016

(87) PCT Pub. No.: WO2015/107068
PCT Pub. Date: Jul. 23, 2015

(65) Prior Publication Data
US 2016/0333691 A1 Nov. 17, 2016

(30) Foreign Application Priority Data

Jan. 14, 2014 (WO) ................ PCT/EP2014/050598

(51) Int. Cl.
E21B 7/02 (2006.01)
G01C 7/06 (2006.01)
(Continued)

(52) U.S. Cl.
CPC .............. *E21C 35/24* (2013.01); *E21B 7/025* (2013.01); *E21C 1/00* (2013.01); *E21C 41/16* (2013.01);
(Continued)

(58) Field of Classification Search
CPC . E21C 35/24; E21C 41/16; E21C 1/00; E21D 9/003; E21D 9/004; E21B 7/025;
(Continued)

(56) References Cited

U.S. PATENT DOCUMENTS 6,608,913 B1 * 8/2003 Hinton .................. B82Y 15/00
382/104
7,860,301 B2 * 12/2010 Se .......................... G01C 11/06
348/43
(Continued)

FOREIGN PATENT DOCUMENTS

CN 101208494 A 6/2008
CN 101946250 A 1/2011
(Continued)

Primary Examiner — Michael J Zanelli
(74) Attorney, Agent, or Firm — Corinne R. Gorski

(57) ABSTRACT

A method and mine vehicle includes at least one scanning device for scanning surroundings of the mine vehicle and producing operational point cloud data. The mine vehicle has a control unit provided with reference point cloud data of the mine. The control unit is configured to match the operational point cloud data to the reference point cloud data in order to determine position of the mine vehicle. The control unit further includes a mine work plan, which is connected to the detected position of the mine vehicle.

11 Claims, 7 Drawing Sheets

(51) Int. Cl.
*E21D 9/00* (2006.01)
*G05D 1/02* (2006.01)
*G01C 21/16* (2006.01)
*E21C 35/24* (2006.01)
*G01S 17/42* (2006.01)
*G01S 17/89* (2006.01)
*G01S 7/48* (2006.01)
*E21B 3/00* (2006.01)
*E21C 41/16* (2006.01)
*G06F 17/50* (2006.01)
*G01S 7/486* (2006.01)

(52) U.S. Cl.
CPC ............ *E21D 9/003* (2013.01); *E21D 9/004* (2013.01); *G01C 7/06* (2013.01); *G01S 7/4808* (2013.01); *G01S 7/4865* (2013.01); *G01S 17/42* (2013.01); *G01S 17/89* (2013.01); *G05D 1/024* (2013.01); *G05D 1/0251* (2013.01); *G05D 1/0274* (2013.01); *G06F 17/50* (2013.01); *G05D 2201/021* (2013.01)

(58) Field of Classification Search
CPC ............... G05D 1/0251; G05D 1/024; G05D 2201/021; G01S 17/89; G01C 7/06
See application file for complete search history.

(56) References Cited

U.S. PATENT DOCUMENTS

| | | | | |
|---|---|---|---|---|
| 7,899,598 | B2* | 3/2011 | Woon | E02F 3/842 |
| | | | | 172/1 |
| 2005/0283294 | A1 | 12/2005 | Lehman et al. | |
| 2009/0202109 | A1 | 8/2009 | Clar et al. | |
| 2010/0086359 | A1* | 4/2010 | Saleniemi | E21B 7/022 |
| | | | | 405/138 |
| 2010/0286965 | A1* | 11/2010 | Saleniemi | E21B 7/022 |
| | | | | 703/1 |

FOREIGN PATENT DOCUMENTS

| | | |
|---|---|---|
| CN | 102798412 A | 11/2012 |
| EP | 1176393 A2 | 1/2002 |
| EP | 1266124 B1 | 5/2006 |
| GB | 2103968 A | 3/1983 |
| JP | 2008025163 A | 2/2008 |
| JP | 2010086031 A | 4/2010 |
| WO | 96/22547 A2 | 7/1996 |
| WO | 2007000488 A1 | 1/2007 |
| WO | 2007000492 A1 | 1/2007 |
| WO | 2010149856 A2 | 12/2010 |
| WO | 2011141629 A1 | 11/2011 |
| WO | WO 2013/170348 A1 * | 11/2013 |

* cited by examiner

MINE VEHICLE AND METHOD OF INITIATING MINE WORK TASK

RELATED APPLICATION DATA

This application is a § 371 National Stage Application of PCT International Application No. PCT/EP2015/050565 filed Jan. 14, 2015 claiming priority of PCT International Application No. PCT/EP2014/050598, filed Jan. 14, 2014.

BACKGROUND OF THE INVENTION

The invention relates to a mine vehicle, which is provided with a scanning device for scanning surroundings of the mine vehicle in order to produce data for determining position and orientation of the mine vehicle.

The invention further relates to a method of initiating mine work task of a mine vehicle at a mine work site.

The field of the invention is defined more specifically in the preambles of the independent claims.

Mine vehicles are used in different mines For performing mine work operations at desired work sites. Positioning of the mine vehicle may require use of extensive and complicated position systems. The known positioning systems and methods may also require skilled operators and are difficult to automate.

BRIEF DESCRIPTION OF THE INVENTION

An object of the invention is to provide a novel and improved mine vehicle provided with a positioning system. A further object is to provide a novel and improved method for initiating a mine work task at a mine work site.

The mine vehicle according to the invention is characterized by features of independent apparatus claim.

The control unit according to the invention is characterized by features of another independent apparatus claim.

The method according to the invention is characterized by features of independent method claim.

An idea of the disclosed solution is that a mine vehicle is provided with one or more mine work devices for executing mine work tasks in a mine. In order to determine position and direction of the mine vehicle, it comprises one or more scanning devices for scanning surroundings of the mine vehicle. The scanning device produces 3D scanning data of the surroundings. The scanning data comprises point cloud data and coordinates of the detected point of the point cloud data may be detected. The mine vehicle is in operational communication with at least one control unit, which receives data and process the data in at least one processor. The one or more control units may be located on-board the mine vehicle or they may be external to the mine vehicle. The control unit is provided with one or more point cloud matching programs, which may be executed in the processor. An initial first point cloud data is input to the control unit. The first point cloud data comprises a stored reference model of the mine in a mine coordinate system. Further, at least one second point cloud data produced by the scanning device of the mine vehicle is also input to the control unit. The second point cloud data comprises operational scanning data of the current position of the mine vehicle. Then the control unit executes the point cloud matching program in order to match the operational second point cloud data to the reference first point cloud data. The control unit may determine position and direction of the mine vehicle in the mine coordinate system on the basis of the determined matching between the operational point cloud data and the reference cloud data. The solution may implement a point cloud best fit method when comparing the point clouds. Furthermore, in order to execute predesigned mine work operation in the mine, the control unit is provided with at least one mine work plan defining position of a mine work site in the mine coordinate system and mine work tasks to be executed at the mine work site. Before initiating the mine work task at the mine work site the control unit is configured to connect the determined position of the mine vehicle and the position of the mine work plan.

An advantage of the disclosed solution relaying on scanning and point cloud matching is that the position determination may be carried out without a need for extensive surveying and measuring infrastructure and equipment. An additional advantage is that the procedure does not need skilled workers and can be easily automated. A feasible further advantage is that the disclosed solution may obtain a strong statistical certainty for the produced results because repeating the scanning and analyzing processes is easy and fast.

According to an embodiment, position of the mine vehicle is determined by utilizing scanning and point cloud processing and matching techniques. In order to facilitate processing of point clouds, the control system may utilize only a certain part of the point cloud data of the mine in the comparison process. Then, the system may be configured to determine an area or section of the mine where the mine vehicle is currently operating, and based on the position data, the system may compare the produced point cloud data to partial point cloud data of the mine. Thus, the comparison is not made to the whole 3D model of the mine plan. Instead, the scanned point cloud data is compared only to a section of the mine where the mine vehicle is operating at the time of the monitoring and the comparison is made to a limited portion of the entire 3D model of the mine. An advantage of this solution is that the amount of the data processed during the comparison may be limited whereby less calculation capacity is needed and processing time may be shorter.

According to an embodiment, the control unit provided with the point cloud matching and processing feature is located on-board the mine vehicle.

According to an embodiment, the control unit provided with the point cloud matching and processing feature is located external to the mine vehicle.

According to an embodiment, the disclosed positioning and navigation system may be implemented for any kind of mine vehicles operating in mines and performing mine work task in accordance with mine work plans. The mine vehicles may be manually controlled or they may autonomously operable devices. The manually controlled mine vehicles may be remote controlled by operators, or alternatively the mine vehicles are manned. Thus, the disclosed solution is suitable to any mine vehicles despite of their control system and degree of automation. Furthermore, the mine vehicles may be different in structure as well as operationally. Thereby, the mine vehicle may be a rock drilling rig, bolting rig, transport vehicle, loading vehicle or measuring vehicle, for example. The mine vehicles of any kind may be provided with scanning modules capable to determine position and direction of the mine vehicle and desired surfaces of tunnels and rock spaces. The scanning module may also serve as a surveying tool when monitoring and detecting surroundings of the mine vehicle. The monitoring module may comprise one or more control units for controlling operation of scanning devices and systems of the module and for processing the produced and gathered measuring results. In addition to, the monitoring module may comprise one or more data communication units for producing data communication connection between the on-board module and a mine control unit of a mine control system. The data communication unit may also communicate with an on-board control unit of the mine vehicle and may transmit data to one or more external terminal devices or serves. The scanning module may comprise fast coupling means so that the module is readily mountable to any mine vehicle.

According to an embodiment, the mine vehicle is a rock drilling rig designed for drilling blast holes and/or drill holes for rock bolts and other reinforcing elements. The rock drilling rig comprises at least one drilling boom provided with a drilling unit. The rock drilling rig is provided with an on-board control unit and/or is in communication with one or more external control units. The control unit is provided with at least one drilling pattern serving as the mine work plan. The drilling plan or pattern defines positions and directions of several drill holes in the mine coordinate system for a round to be drilled at the predetermined drilling position in the mine. Further, the control unit is configured to connect the determined position of the rock drilling rig and the position of the drilling pattern for initiating the drilling at the drilling position. Thus, the scanning technique is utilized for connecting position and direction of the rock drilling and the drilling pattern or plan.

According to an embodiment, the mine vehicle is arranged to operate in an excavated rock space comprising a tunnel line and a realized face in a depth direction of the tunnel line. The rock space may be a tunnel and the face may be located at an end of the tunnel. The realized face is formed when the previous round is blasted and the detached rock material is moved away from the end of the tunnel. Position and shape of the face may deviate from the planned position and shape simply because of the fact that the face is formed by blasting and is influenced by several mine work steps. In order to improve efficiency and quality of the excavation process, the position of the face is determined. Therefore, the mine vehicle is provided with means for detecting the face and for determining position of the face relative to the tunnel line in depth direction. The control unit may define the position of the mine work plan on the basis of the determined depth position of the realized face.

According to an embodiment, the mine vehicle is operable in an excavated rock space comprising a tunnel line and a realized face in a depth direction of the tunnel line. The rock space may be a tunnel or corresponding space. The excavation of the tunnel is advanced in the depth direction. The face may be located at the end of the existing tunnel. The mine vehicle comprises measuring means for determining the greatest depth of the tunnel face in the depth direction of the tunnel line. The control unit is configured to determine the detected greatest depth and to define the position of the face on the basis of the greatest depth. The greatest depth of the tunnel face may be determined by means of the scanning device, or alternatively, by means of a boom provided with conventional sensors and measuring devices.

According to an embodiment, the mine vehicle is a rock drilling rig and the control unit is provided with several predesigned drilling patterns. Each of the drilling patterns or plans may be intended for dedicated depths on a tunnel line of the excavated rock space. Sometimes, the same drilling pattern may be implemented for two or more rounds having same characterizing features. The rock drilling rig comprises scanning or other measuring means for determining the greatest depth of the tunnel face, and based on that data, the control unit may determine realized position of the face relative to a planned position of the face. The control unit may then calculate the desired position for the drilling pattern to be executed. In other words, the control unit is configured to adjust position of the drilling pattern on the basis of the determined greatest depth. In this embodiment the greatest depth of the excavated tunnel face is detected in relation to the planned tunnel line depth, and this detected depth position of the face is used when connecting the position of the rock drilling rig and the mine together.

According to an embodiment, the mine vehicle is in accordance with the rock drilling rig disclosed in paragraphs above. The control unit is provided with several predesigned drilling patterns. Further, the control unit is configured to determine realized position of a face of the excavated tunnel or rock space and may modify the drilling patterns based on the position data of the face. The control unit may lengthen or shorten the drilling pattern, for example. This embodiment may be utilized especially when the same drilling pattern is utilized in two or more consecutive rounds.

According to an embodiment, the control unit of the rock drilling rig is provided with several predesigned drilling patterns, which are intended for dedicated depths on a tunnel line. The control unit determines position of the realized face of the tunnel on the basis of scanning and/or measuring results. The position of the face may be determined by detecting greatest depth of the tunnel in the direction of the tunnel line. The control unit is configured to select the drilling pattern to be executed on the basis of the position of the face.

According to an embodiment, the mine vehicle is a rock drilling rig and is arranged to drill several drill holes for each round of a tunnel or corresponding rock space. Excavation of the tunnel advances by drilling and blasting consecutive rounds. Blasting of the round produces a new tunnel face and also contour surfaces limiting the space. The rock drilling rig comprises scanning or other measuring means for determining the realized excavation of the previous round. The control unit may modify a drilling pattern of the following round on the basis of the determined realized excavation of the previous round. Thereby it is possible to avoid quality problems, such as over and under excavation, in the following rounds.

According to an embodiment, the mine vehicle in provided with a scanner device configured to determine together with the control unit realized location of the face. The location of the face may be determined in relation to the mine, in relation to the mine work plan, such as drilling pattern, or in relation to the carrier of the mine vehicle. Coordinate transformations may be executed in the control unit for producing desired data.

According to an embodiment, the scanning device of the mine vehicle is arranged to scan towards the realized face, whereby point cloud data provided with coordinates is produced of realized surfaces of previously excavated at least one round. The control unit is configured to determine properties of the realized surfaces on the basis of the produced point cloud data. The control unit may compare the determined realized properties of the realized surfaces to predetermined design properties of the at least one round. The control unit may determine position of the face, tunnel profile of the face and/or topography of the face in the mine coordinate system on the basis of the produced point cloud data. Alternatively, or in addition to, the control unit may determine direction of the face in relation to the tunnel line on the basis of the produced point cloud data. Furthermore, the control unit may be configured to compare the determined realized properties of the face to predetermined design properties of the face, and it may also be configured to modify the drilling pattern in response to deviations detected in the comparison. The control unit may modify look out angle, hole spacing or length of the round determined in the drilling pattern, for example. Any other corrective actions may be executed on the basis of the detected quality and status data.

According to an embodiment, the mine vehicle comprises at least one boom provided with a mine work device, which is located at a distal portion of the boom. The boom is instrumented and location of the face relative to the carrier is determined by arranging the mine work device in contact with the face and determining the location of the face by means of the instrumented boom comprising sensors or measuring devices. The detected position coordinates of the mine work device in machine coordinates system may be converted to mine coordinates of the mine coordinate system by means of coordinate transformation program executed in the control unit.

According to an embodiment, position and direction of the mine work device is determined by scanning the surroundings of the mine vehicle, whereby point cloud data of the mine work device is created. The control unit is provided with a reference point cloud data of the mine work device. The reference data may be design data of the mine work device, or it may be produced by initial scanning of the mine work device. A point cloud processing program is executed in the control unit for comparing the scanned point cloud data and the reference point cloud data in order to search and detect the mine work device in the scanned point cloud data. After the mine work device has been found from the point cloud data, the position and direction of the mine work device may be determined on the basis of the coordinates of matching points of the point cloud.

According to an embodiment, the control unit is configured to determine and record positions and directions of the drill holes influenced by the mine work device of the mine vehicle in the mine coordinate system. The mine vehicle may be a rock drilling rig or a rock reinforcing rig, which both comprise means for influencing drill holes. The control unit may determine position and direction of a feed beam of a drilling unit, and may record the determined data as the drill hole position and direction data when the drilling unit is at the drill hole. An advantage of this solution is that positions and directions of the drill holes and rock bolts may be recorded and stored without any additional devices and measures.

According to an embodiment, the mine work device is configured to serve also as a surveying tool, whereby the mine work device may be positioned against an object and the position data of the mine work device is determined by means of the scanning and point cloud matching or by means of an instrumented boom provided with sensors.

According to an embodiment, the mine vehicle is provided with scanning means for producing point cloud data on the surrounding surfaces. The control unit is provided with a mine plan comprising 3D model of the mine. The 3D model of the mine comprises point cloud data in mine coordinate system. The control unit is configured to compare the point cloud data produced by means of the scanning device with the 3D model of the mine. The control unit may comprise suitable programs, algorithms, processors and data processing means for detecting in the scanning data new or changed surrounding point cloud objects at the scanned position. Thereby, newly created or changed walls or other surfaces of the mine are detected and recorded. The mine control unit may incorporate the new point cloud data to the point cloud data of the realized 3D model of the mine. Thereby, the mine control unit may update the 3D model of the mine on the basis of the received scanning data. Thanks to this embodiment, changes in the mine are noted and may be taken into consideration. When the realized 3D model of the mine is up to date, reliable information about the mine may be used for several purposes According to an embodiment, the mine vehicle is provided with scanning means for producing point cloud data on the surrounding surfaces. The control unit is configured to process the received scanning data by extracting point cloud data of the surrounding surfaces and removing point cloud data of all the other objects, whereby a simplified point cloud data of the surrounding surfaces is being created. Thanks to the simplified point cloud data, storing and handling of data is facilitated. Size of a data package of the simplified point cloud data may be smaller and the data does not include unnecessary information. Further, the principle of the simplified point cloud data may be utilized when surveying new or changed areas of tunnels. Then the control unit may compare the new simplified point cloud data with the point cloud data of the 3D model of the mine. Based on the comparison of the point clouds, the mine control unit may update the 3D model of the mine by incorporating the simplified point cloud data to the realized 3D model of the mine. Thanks to the simplified point cloud data, no irrelevant data is incorporated to the 3D model of the mine.

According to an embodiment, the mine vehicle provided with the scanning device is serving as a mobile surveying device. The mine vehicle may execute the surveying continuously when executing dedicated normal operations of the mine vehicle. If the mine vehicle is a rock drilling rig or a reinforcing rig, it may scan the surroundings when it stops at a work site for executing drilling or feeding reinforcing elements or material. It may also be defined that the scanning is executed at least once each time when the mine vehicle is not moving. Thanks to this procedure, the mine may be surveyed repeatedly and in parallel to the normal operational process without any need for extra resources. The 3D model of the mine may thus be accurate and updated.

According to an embodiment, the control unit is provided with at least one incorporating rule defining required matching ratio between the second scanning data and the reference point cloud data. The control unit is configured to incorporate the new point cloud data to the reference point cloud data of the reference model of the mine only when the set incorporating rule is fulfilled.

According to an embodiment, the mine vehicle is provided with a scanning module comprising a frame, one or more scanning device and one or more data transmission devices or units. The scanning module may communicate with one or more control units by means of the data transmission device. The scanning module may also comprise one or more control units provided with processors and needed computer programs and algorithms for processing the produced monitoring data. The monitoring module may be designed so that it is mountable to any mine vehicle. A fastening unit of the scanning module may comprise fast coupling means.

According to an embodiment, the scanning device is a laser scanner.

According to an embodiment, the scanning device comprises at least one camera. The scanning device may be based on stereo vision system comprising at least two cameras. Alternatively, the scanning may be based on a technology known as a depth from focus-system, wherein one camera is used and the method basically works by taking a focus stack of an object, and then analyzing the luminance of each pixel in relation to its neighbors. The control unit may be provided with image processing system for processing data received from the one or more cameras.

According to an embodiment, the scanning device comprises in addition to the scanning unit at least one camera for recording color information of the scanned obstacles. The recorder color information may be connected to the scanned point cloud data. This way additional information may be gathered.

According to an embodiment, the 3D scanning data is obtained by round trip time of flight of a laser that is swept across measured surface or object. This type of remote sensing technique is also known as LiDAR (Light Detection And Ranging).

According to an embodiment, the 3D scanning data is obtained by round trip time of flight of single (modulated) light source and the return times of reflections from different parts of the measured surface or object. This type of remote sensing technique is also known as ToF (Time of Flight). In this embodiment ToF-cameras may be used.

According to an embodiment, the 3D scanning data is obtained by geometry of a known pattern of light projected to the measured surface or object shown in one or more camera images. This type of 3D scanning is also known as a structured light 3D scanning technique.

According to an embodiment, the 3D scanning data is obtained by analysis of multiple pictures taken of same target from different points of view. In this embodiment a stereo camera system may be exploited. The control unit may be provided with an image processing system for processing image data received from the two or more cameras.

According to an embodiment, the mine vehicle comprises at least one data communication device allowing data communication between the on-board control unit and one or more external control units. The data communication may be based on any wireless data transfer technique. The mine may be provided with a wireless network utilizing radio wave signals. The data transmission may be based on a wireless local area network (WLAN), for example.

According to an embodiment, the control system may comprise one or more computers or control units external to the mine and mine vehicle. Alternatively, the control system may comprise one or more servers allowing access to electrical terminal devices for retrieving the data transmitted from the control unit where the scanning data in analyzed. The control unit may also be considered to mean other data communication and distribution means allowing access to the processed data.

According to an embodiment, the control unit provided with at least one processor and the at least one point cloud matching program is located in the mine vehicle. Thus, the mine vehicle is provided with all the needed resources to gather data form the surroundings and to process it on-board. This embodiment is operable also in situations where the data connection to mine system is lost or is not operating properly. Latest version of the reference model of the mine may be downloaded to the on-board control unit at suitable instances and may be stored in an on-board storage media. The downloaded mine model may consist of the original mine model, or it may be filtered to only include descriptive patterns and features. It is also possible to download only limited point cloud data set of a section of the mine where the mine vehicle is presently operating.

According to an embodiment, the control unit provided with at least one processor and the at least one point cloud matching program is located external to the mine vehicle. The scanning data may be transmitted to the external control unit via wireless data transmission connection, for example. The control unit may process the received scanning data and may send processed data back to a control unit, which is located in the mine vehicle. The analyzing and processing service may be implemented as a cloud service in an external server, such as a mine server, whereby the control unit of the mine vehicle needs not to be provided with calculation capacity.

According to an embodiment, a control unit for determining position and direction of a mine vehicle comprises connection means for being in operational communication with the mine vehicle comprising at least one scanning device, receiving means for receiving from the mine vehicle operational scanning data of the current position of the mine vehicle, the scanning data comprising operational second point cloud data produced by the at least one scanning device, and processing means for processing the received operational scanning data; and the control unit is provided with at least one point cloud matching program allowed to be executed in the processor and an initial first point cloud data comprising stored reference model of the mine in a mine coordinate system, the control unit is configured to execute the point cloud matching program in order to match the received operational second point cloud data to the reference first point cloud data and to determine position and direction of the mine vehicle in the mine coordinate system on the basis of the determined matching between the operational point cloud data and the reference cloud data, the control unit is provided with at least one mine work plan defining position of a mine work site in the mine coordinate system and mine work tasks to be executed at the mine work site, and the control unit is configured to connect the determined position of the mine vehicle and the position of the mine work plan for initiating the mine work task at the mine work site.

The detailed embodiments, which are disclosed in connection to the mine vehicle, also relate to the method, and vice versa.

The same equipment comprising the scanning device, point cloud matching program and control unit may be utilized in navigation, position detection of the mine work device and drill holes, mine surveying, collision prevention and also for providing information for mine control and fleet management systems.

The above-disclosed embodiments can be combined to form suitable solutions provided with necessary features disclosed.

BRIEF DESCRIPTION OF THE FIGURES

Some embodiments are described in more detail in the accompanying drawings, in which.

For the sake of clarity, the figures show some embodiments of the disclosed solution in a simplified manner. In the figures, like reference numerals identify like elements.

DETAILED DESCRIPTION OF SOME EMBODIMENTS

Figure 1:
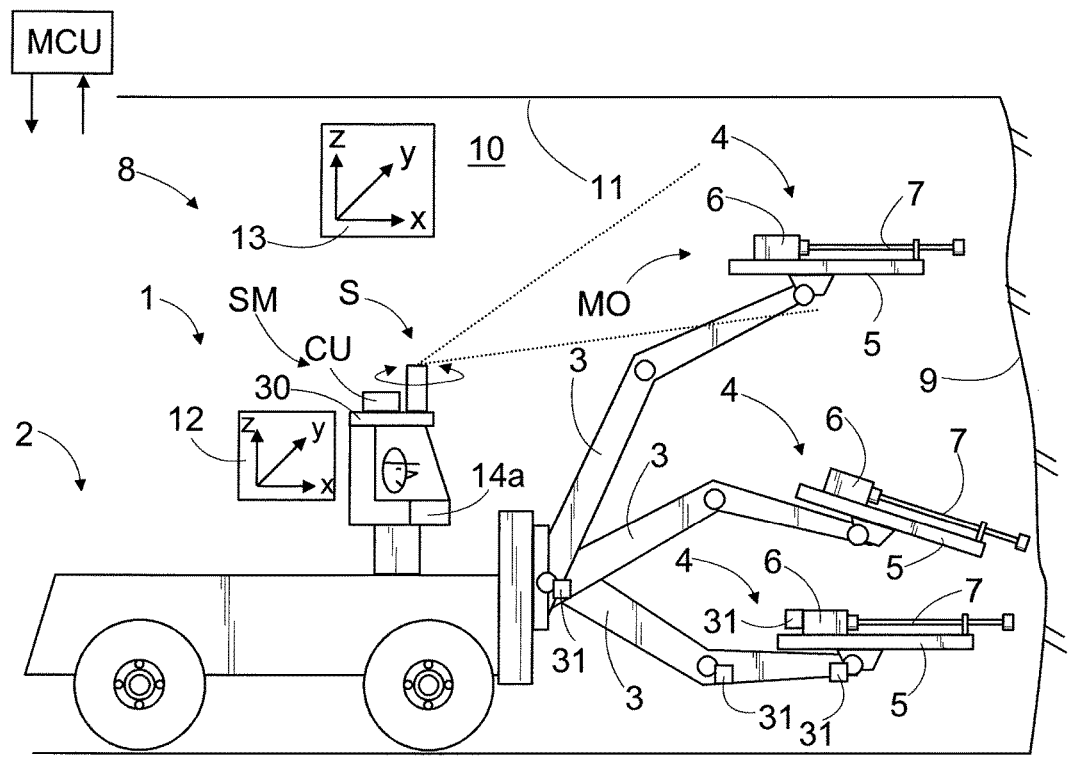
FIG. 1 is a side view of a rock drilling rig provided with scanning and monitoring means.
Figure 12:
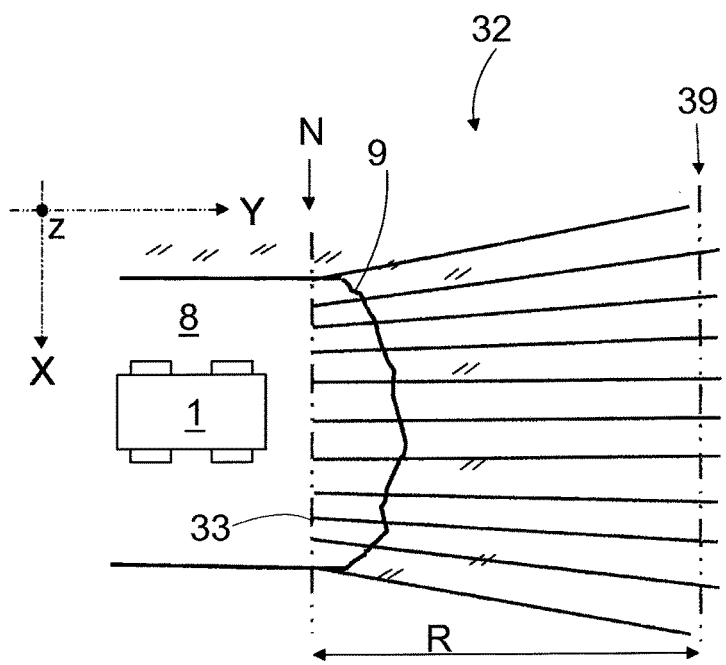
FIG. 12 is a schematic top view showing positioning of a rock drilling rig and a drilling pattern to be drilled.

FIG. 1 shows a rock drilling rig 1 as an example of a mine vehicle. Also rock bolting rigs, charging rigs, measuring vehicles, transport vehicles and loading vehicles are mine vehicles. Thus, the mine vehicles may be provided with mine work devices such as rock drilling units, bolting units, charging units, loading units and load carrying units, as it is shown in FIG. 12. The disclosed solution may be applied for all type mine vehicles.

The rock drilling rig 1 may comprise a movable carrier 2 and one or more booms 3 connected to the carrier 2. At a distal end portion of the boom 3 may be a drilling unit 4. The drilling unit 4 may comprise a feed beam 5 and a rock drilling machine 6 supported on it. The rock drilling machine 6 may comprise a shank at a front end of the rock drilling machine 6 for connecting a tool 7. At least one boom 3 may comprise a mine work device other than the drilling unit. Thus, the mine work device may be a rock bolting unit or a charging unit, for example.

In FIG. 1 the rock drilling rig 1 is operating in an underground mine space 8, which may be a tunnel, storage hall or corridor, for example. The mine space 8 may comprise an end face surface 9, wall surfaces 10 and a roof surface 11. The rock drilling rig 1 is provided with one or more scanning devices S for measuring surroundings of the rock drilling rig 1. The scanning device S may scan 360° and may thus measure the surrounding surfaces and other obstacles around the rock drilling rig 1 and produce scanning data for the system. The scanning device S may comprise a laser scanner, a camera or any other device capable of producing point cloud data. The scanning device S may be placed on the carrier 2.

The scanning device S may be placed in a known position on the mine vehicle. Then coordinates of the scanning device are known in machine coordinates system 12 of the mine vehicle. The scanning device sees around and may then detect also one or more objects, parts or components of the mine vehicle as well.

Alternatively, the position of the scanning device S need not be accurately predetermined and calibrated when the disclosed system utilizes point cloud matching techniques. Then, at least one reference component or object of the rock drilling rig is detected in the scanning data and produced point cloud data of the detected object is utilized in determination of relative position of the scanning device S on the carrier 2.

The rock drilling rig 1 has a machine coordinate system 12 and the mine has a mine coordinate system 13. On-board the rock drilling rig 1 may be one or more control units 14a for receiving scanning data, performing point cloud matching and searching measures, producing position data and executing needed coordinate transformations according to principles disclosed in this patent application. The control unit may also be provided with one or more mine work plans, in this case drilling pattern, according to which mine work plans mine work operations are executed at the work site.

The scanning device S may be part of a scanning module SM comprising a frame 30 provided with mounting means, and a control unit CU provided with a processor and needed programs for executing the above discussed position determination procedures.

The boom 3 may be without any sensors since the needed position and direction data may be produced by the scanning. However, the boom 3 and the mine work device may alternatively comprise conventional sensors or measuring means 31 for position and direction determination The position and direction of the mine vehicle 1 in the mine coordinate system may be determined by utilizing scanning and point cloud matching techniques. The scanning means may also be used for determining position of the end face 9, profile of the mine space 8, and also topography of the face and the inner surfaces of the space 8.

FIG. 1 further discloses that the mine vehicle 1 may communicate with one or more external mine control units MCU, which may be part of a mine control system.

Figure 2:
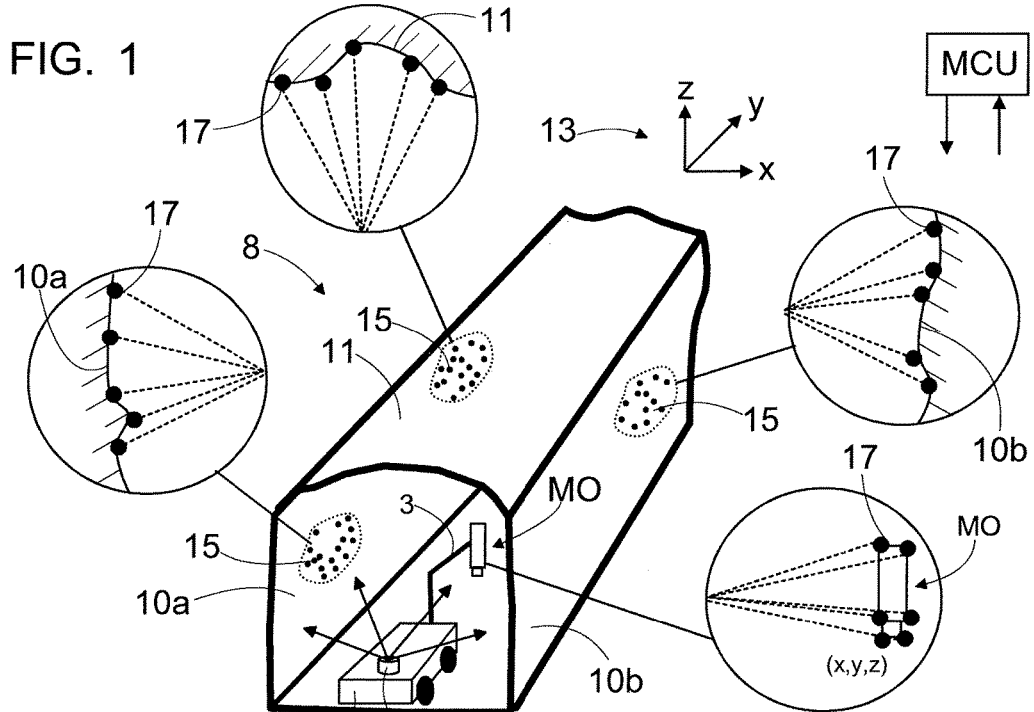
FIG. 2 shows schematically a principle of scanning surfaces and physical obstacles surrounding a mine vehicle.

FIG. 2 shows scanning of surfaces of a mine space 8 surrounding a mining vehicle 1. Thus, point cloud data 15 may be produced of wall surfaces 10a, 10b and a roof surface 11. Also, greatest depth of the space 8 i.e. the end face may be scanned. As it is disclosed in the simplified FIG. 2 with enlargements, the surfaces of the wall surfaces 10a, 10b and the roof surface 11 have individual shapes since the rock material is detached by blasting. Topography of the surfaces may be considered to be a kind of finger print of the mine. 3D scanning data of the realized surfaces of the mine space 8 may be produced. Thus, a 3D model of the mine may be updated on the basis of the scanned point cloud data.

FIG. 2 also discloses that by means of the scanning, a monitored object MO may also be detected and a point cloud of it may be produced. The point cloud data of the monitored object MO comprises points, which are characteristic for the monitored object. Based on the shape the points create, the monitored object MO may be recognized in a searching step of the scanning procedure. The control unit 14a may then determine coordinates for the recognized points defining the monitored object in the point cloud and may determine position and direction of the monitored object in the machine coordinate system 12. The control unit 14a may transform the position and direction data of the monitored object MO into coordinates of the mine coordinate system 13 when the location of the mine vehicle 1 is known. The position of the mine vehicle 1 in the mine may be determined by means of the scanning techniques. The position of the mine vehicle 1 and the monitored object MO, as well as information about the realized surface topography of the scanned mine space 8 and location of the faced surface may be determined.

Figure 4:
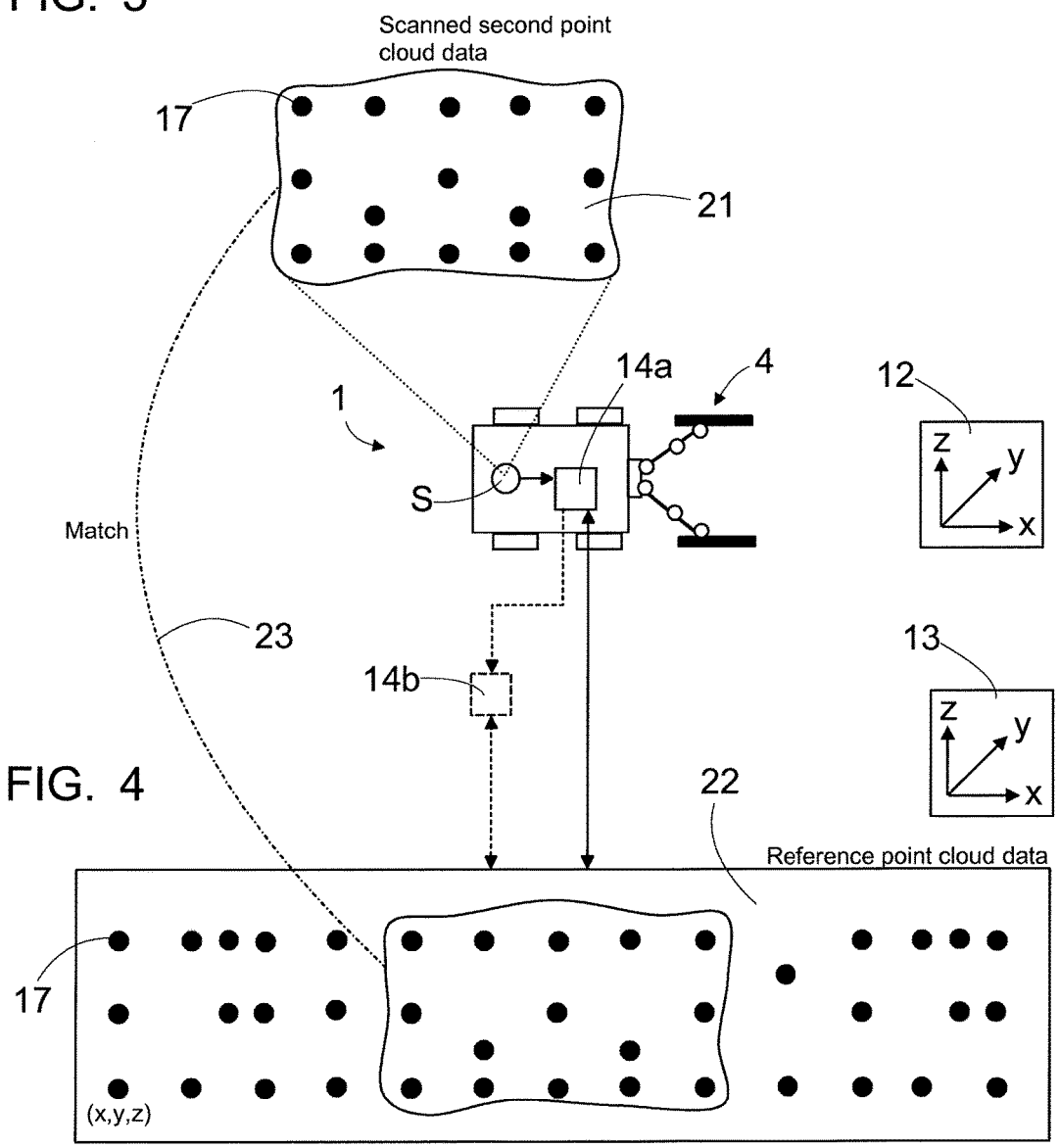
FIG. 4 is a schematic view of a basic principle of point cloud matching utilized when processing scanning results.

In FIG. 2, as well as in FIG. 4, it is illustrated by black dots 17 points where a ray of a scanning device S meets a physical target and causes detection. The point cloud data 15 comprises several points 17 created by the scanning. The points 17 are shown as black dots. It can be considered that the point cloud data represents information of what the scanning sees. Every point 17 has coordinates x, y and z in machine coordinate system 12, whereby position and direction of the monitored object MO may be determined relative to the scanning device S in the machine coordinate system 12. The monitored object MO may be found from the point cloud data on the basis of reference data input to the control unit 14a or Cu.

Also, position, direction and topography of a face surface at a bottom of the mine space 8 and other surfaces may be determined in the mine coordinates system 13 when the position of the mine vehicle is known and coordinate transformations are utilized.

Figure 3:
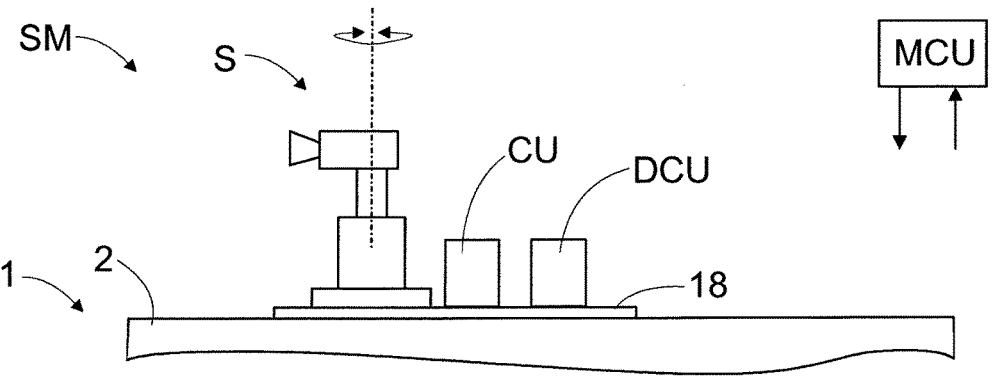
FIG. 3 is a schematic side view of a scanning module arranged on a carrier of a mine vehicle.

In FIG. 3 a scanning module SM, is arranged on a carrier 2 of a mining vehicle 1. The scanning module SM comprises a scanning device S, a frame 18 and a control unit CU. The control unit CU may be arranged to process the measuring data received from the scanning device S and the measuring device and may send by means of a data communication unit DCU only the processed data and data elements to a mine control unit MCU or any other external control unit. Further, the scanning device S or scanning module may comprise fast coupling means whereby it can be easily mounted to the mine vehicle 1.

FIG. 4 discloses a basic principle of determining position and orientation of a mine vehicle 1 by means of scanning and point cloud matching. A surrounding of the mine vehicle 1 is scanned and a second point cloud data 21 is produced. An initial first point cloud data 22 may be created beforehand and it may be stored to a control unit 14a on-board the mine vehicle 1 or to an external control unit 14c. The control unit 14a, 14c may be provided with a processor and a point cloud matching program or algorithm for matching the second point cloud data 21 to the first point cloud data 22. Thus, the first point cloud data 22 serves as a reference point cloud data and the second point cloud data 21 serves as an operational point cloud data. In FIG. 4 the match 23 is shown in a strongly simplified manner. On the basis of the match 23, the control unit 14a or 14b may determine position and orientation of the mine vehicle 1 in a mine coordinate system 13. Every point 17 of the point cloud data has x-, y-, and z-coordinates. In the simplified example of FIG. 4, the second point cloud data 21 fits completely to the reference point cloud data 22.

The above mentioned principles of point cloud matching analysis and best fit procedures of point clouds may be utilized also for searching and detecting position and direction of a monitored object, such as a boom or mine work device of a mine vehicle. During pattern matching the system searches the monitored object and calculates position and direction data for it.

Figure 5:
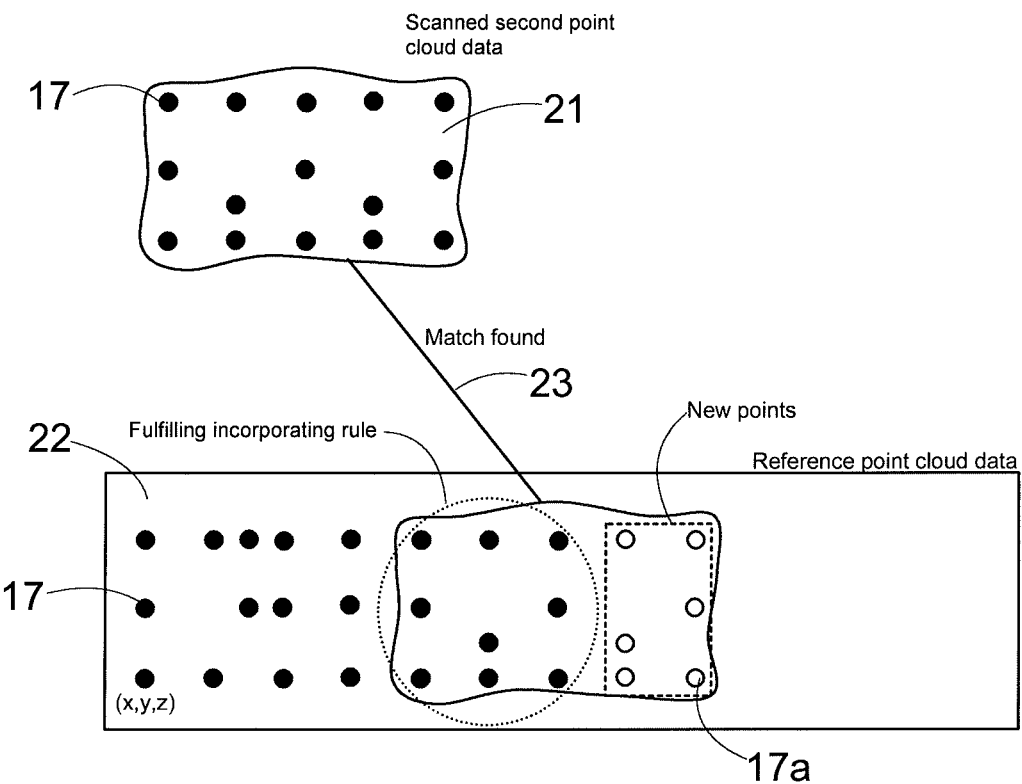
FIG. 5 is a schematic and strongly simplified view of a process detecting new or changed surfaces of a mine, and incorporating the detected deviating point cloud data after matching scanned data with a reference data.
Figure 6:
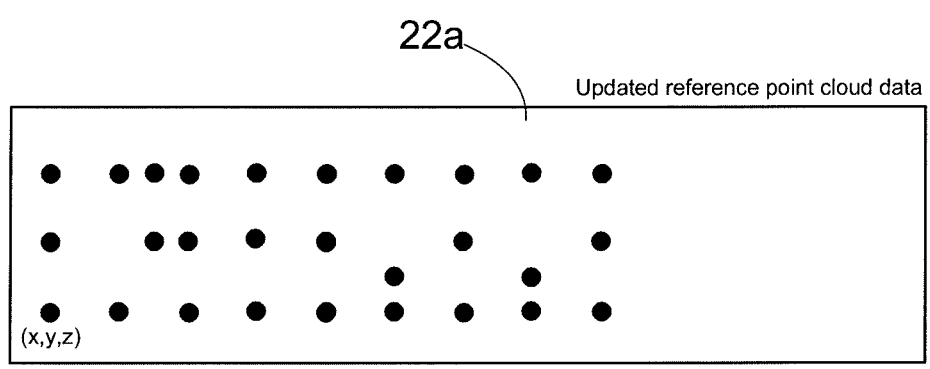
FIG. 6 is a schematic and strongly simplified view of an updated reference point cloud data, which incorporates detected new scanned points.

FIG. 5 discloses detecting new or changed surfaces of a mine. A mine vehicle provided with a scanning device may serve as a mobile surveying device. Thus, the mine vehicle may scan the surroundings when it stops at a work site for executing drilling or any other defined mine operation. A control unit is configured to execute point cloud matching analysis and to compare an operational second scanning data 21 to a reference scanning data 22 stored in the control unit or retrieved therein. During pattern matching the system detects if the operational second scanning data 21 comprises one or more new surrounding points 17a, which do not exist in the reference point cloud data 22. These new points 17a are shown in FIG. 5 as dots with white filling. The control unit may be provided with one or more incorporating rules defining required matching ratio between the second scanning 21 and the reference point cloud data 22. The incorporating rule may define a need for 50% matching, for example. If the set incorporating rule is fulfilled, the new points 17a are incorporated to the reference point cloud data 22. Thus, the mine vehicle allows newly created walls or changed surfaces to be detected and recorded. FIG. 6 discloses the updated new reference point cloud data 22a, which incorporates detected new scanned points.

Figure 7:
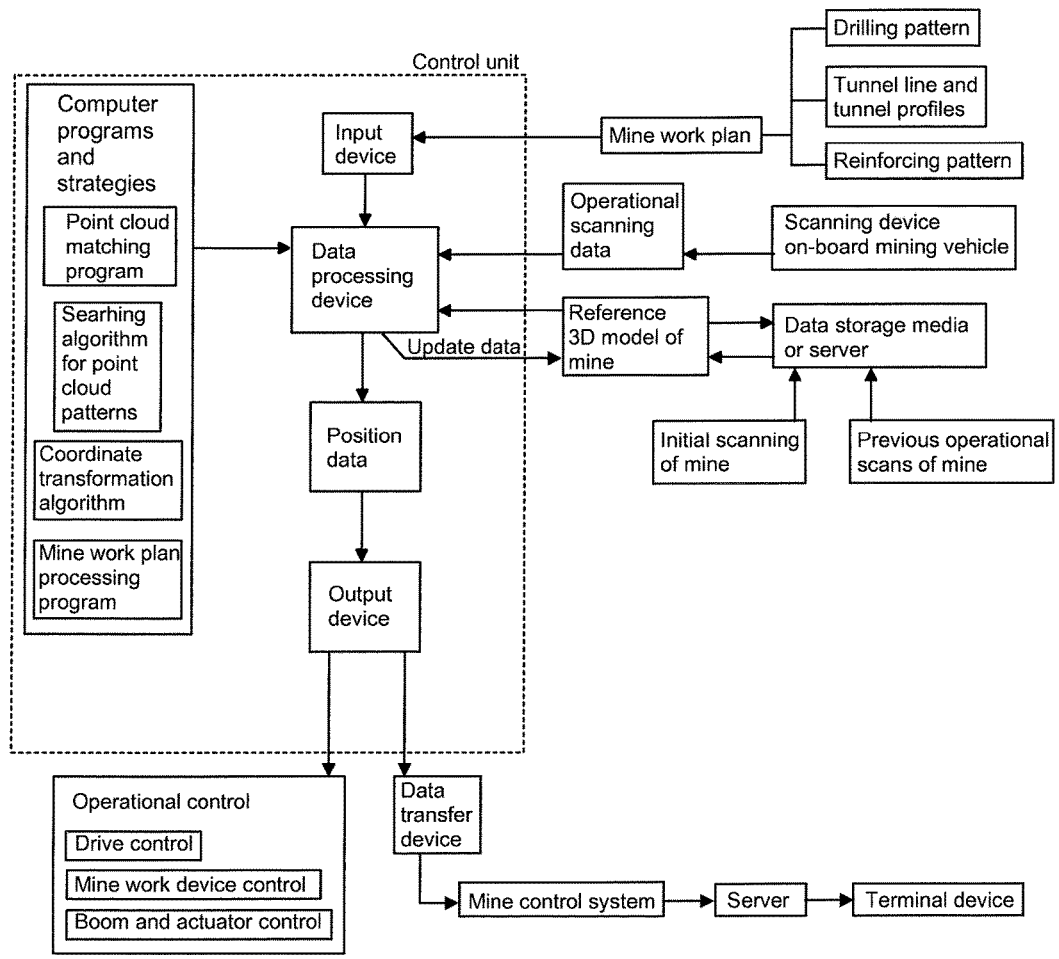
FIG. 7 is a schematic diagram showing related elements, processing means and features of a control unit being able to process point cloud data.

FIG. 7 shows a feasible control unit and needed programs executable in a processor of the control unit for processing the produced point cloud data. The control unit produces position data which may be utilized in operational control of the mine vehicle and for determining position of the mine vehicle and a mine work plan.

The disclosed control unit may be on-board the mine vehicle, whereby it may pre-process the scanning data and may transmit only the outcome to a mine control unit by means of a data transmission device.

Figure 8:
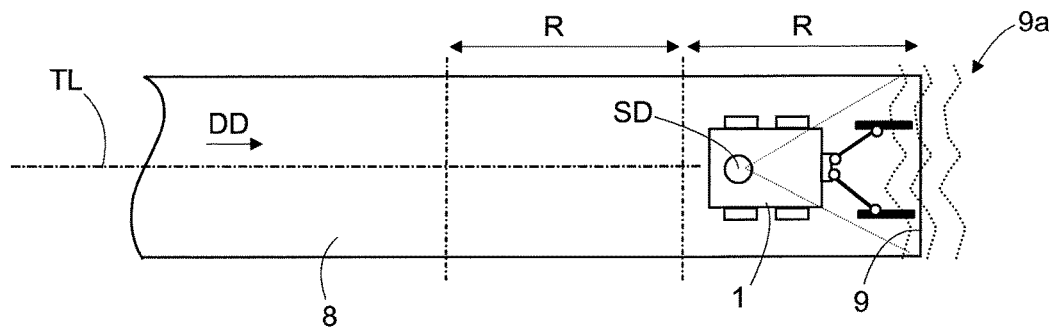
FIG. 8 is a schematic top view of a face drilling method wherein a rock drilling rig is positioned at a drilling site for drilling drill holes in accordance of a drilling pattern to an end face of a tunnel.

FIG. 8 illustrates a face drilling method wherein a rock drilling rig is positioned at a drilling site for drilling drill holes in accordance of a drilling pattern to an end face of a tunnel. Alternatively, drilling of a round R may be controlled according to any other type of excavation plan. Depth of the tunnel increases as the excavation advances. Thus the depth of the tunnel increases round by round. Direction of the depth DD is shown by means of an arrow.

The excavated rock space 8 where the face drilling rig 1 operates comprises a tunnel line TL and a realized face 9 in a depth direction DD of the tunnel line TL. The face 9 is located at an end of the tunnel 8. The face 9 is formed when the previous round R is blasted. Position and shape of the face may deviate from the planned position and shape, which is demonstrated by broken lines 9a. The face drilling rig 1 is provided with a scanning device SD or module for determining position of the rig in the mine. The scanning technique may also be used for determining position of the face 9 relative to the tunnel line TL in depth direction DD. The system may determine the greatest depth of the tunnel face 9 in the depth direction DD of the tunnel line TL and may define the position of the face accurately on the basis of the greatest depth. In addition to, the produced scanning data may be used for determining tunnel profile of the face 9, direction of the face 9 relative to the tunnel line TL and topography of the face 9.

Figure 9:
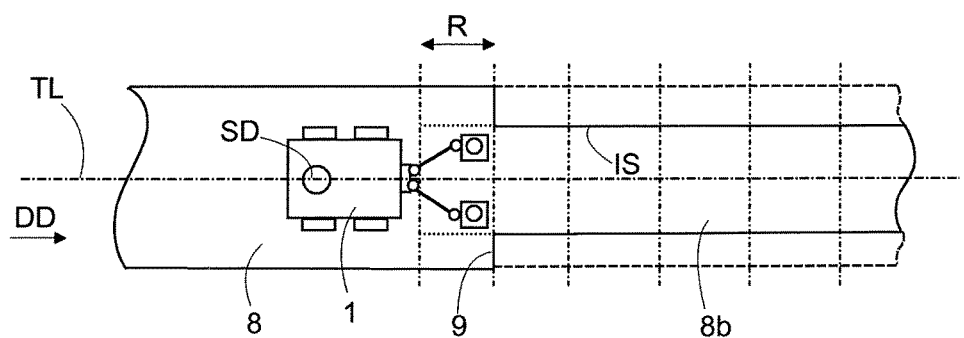
FIG. 9 is a schematic top view of a fan drilling method wherein a rock drilling rig is positioned at a drilling site for drilling drill holes in accordance of a drilling pattern to an inner contour surface of a pilot tunnel.
Figure 10:
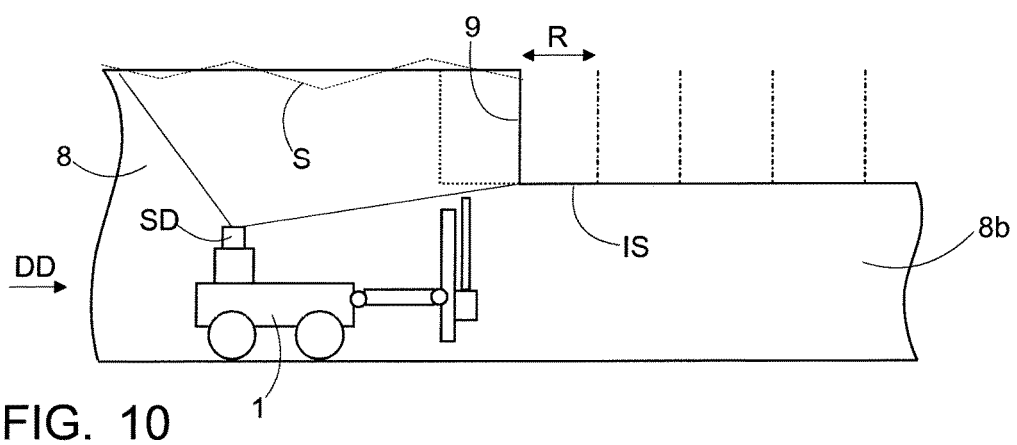
FIG. 10 is a schematic side view of the fan drilling method.

FIGS. 9 and 10 illustrate a principle of a fan drilling method wherein a rock drilling rig 1 is positioned at a drilling site for drilling drill holes in accordance of a drilling pattern to an inner contour surface IS of a pilot tunnel 8b. In the fan drilling a fan drilling pattern defining positions and directions of drill holes may be used. The fan drilling rig 1 is provided with a scanning device SD or module for determining position of the rig in the mine. The scanning technique may also be used for determining position of the face 9 relative to the tunnel line TL in the depth direction DD. Surfaces S and tunnel profiles of the excavated tunnel 8 may also be scanned and detected.

In the face drilling and fan drilling it is also possible to use a predesigned tunnel line TL as a mine work plan instead of drilling patterns. Further, inner profiles of the tunnel along the tunnel line may also be predetermined and input to the control unit. The mine work plan may also define a minimum profile and a maximum profile for the desired tunnel portions.

Figure 11:
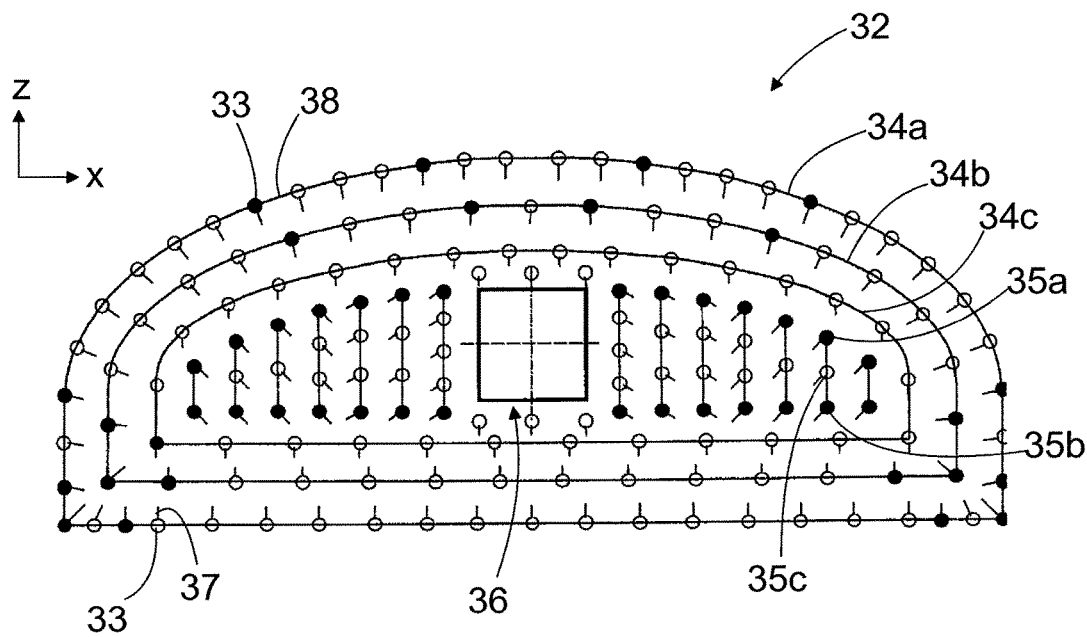
FIG. 11 is a schematic view of a drilling pattern.

FIG. 11 shows an xz projection of a drilling pattern 32 for face drilling. The drilling pattern 32 defines a plurality of drill holes 33 arranged on a plurality of nested rows 34a-34c. Furthermore, the drilling pattern 32 may comprise field holes 35a to 35c placed in a section between the innermost drill hole row 34c and a cut 36. In the drilling pattern 34, the drill hole 33 may be presented as a circle. Furthermore, the direction of each drill hole 33 may be denoted by a directional line 37 in the drilling pattern 32. Distance between the drill holes 33 is called hole spacing 38. Properties and parameters of the drilling pattern 32 may be modified by executing a drilling pattern design program or a corresponding mine work plan processing program in a processor of a control unit. Monitoring and sensing results of the previous rounds may be taken into consideration when amending following drilling patterns.

FIG. 12 shows a principle of a drilling pattern 32 in association with a round R to be drilled. A face 9 of a tunnel 8 to be excavated may be provided with a navigation plane N whereto the coordinate system of the drilling pattern 32 may be attached. The navigation plane N may locate at the front of the face 9. The drilling pattern 32 may include a determined location and direction of the rock-drilling rig 1 in the coordinate system, in which case the rock-drilling rig 1 is navigated in accordance with the coordinate system before the drilling is started. The bottom of the round R may further include a blast plane 39 at a distance corresponding to the length of the pattern from the navigation plane N.

Figure 13:
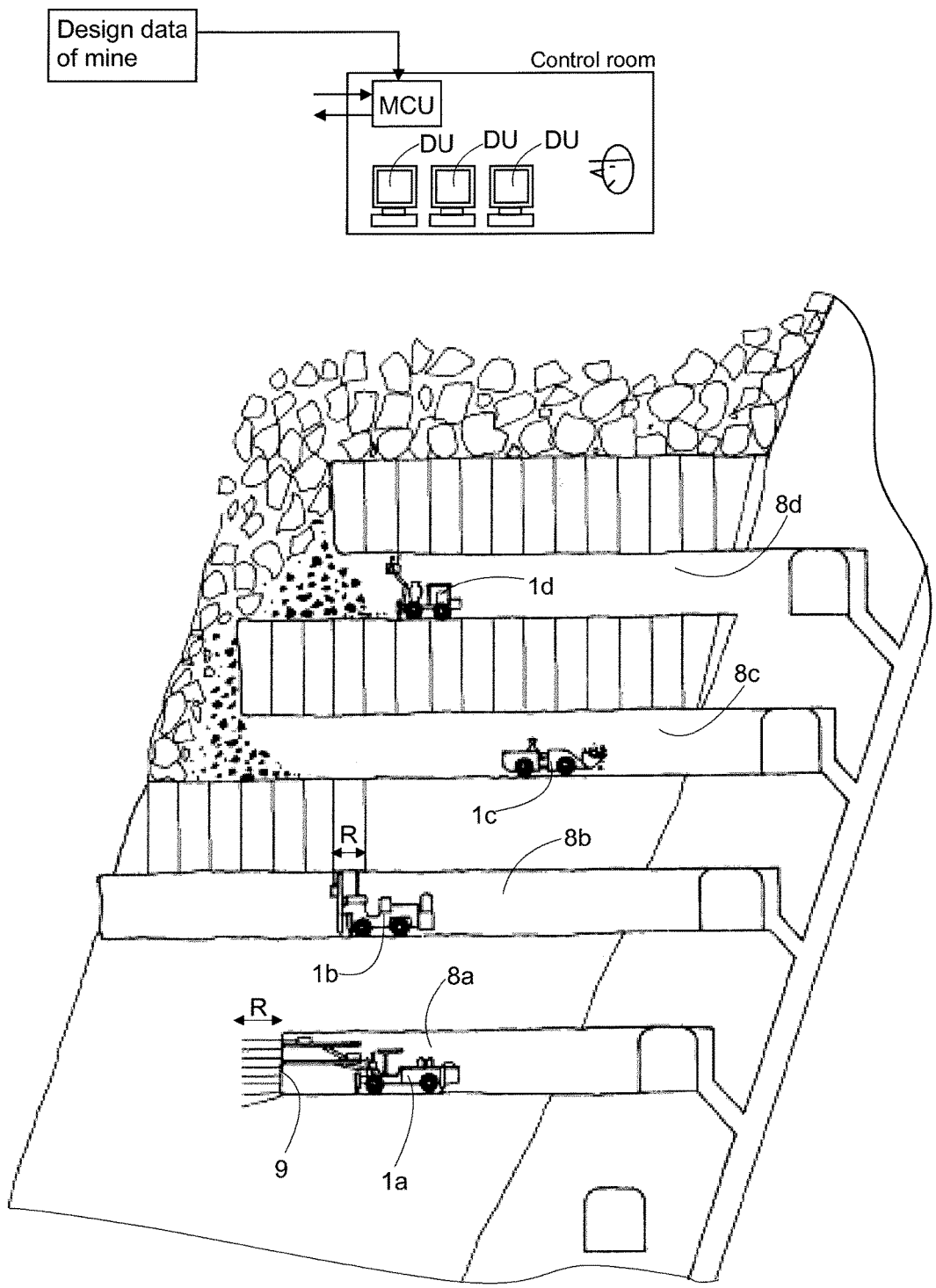
FIG. 13 is a schematic view of a mine comprising several tunnels and different type of mine vehicles operating in the tunnels and being in communication to a mine control system.

FIG. 13 shows a mine comprising several tunnels 8a-8d and different mine vehicles 1a-1d operating in the tunnels. At the lowermost tunnel 8a there is face drilling rig 1a for drilling blast holes to an end face of the tunnel. A fan drilling rig 1b is drilling a fan-like drilling pattern in a second tunnel 8b. In a third tunnel 8c a loading vehicle 1c is carrying detached rock material, and further, a charging vehicle 1d is operating in a fourth tunnel 8d. All these mine vehicles operating in the mine may be provided with the above disclosed mine work plans and scanning modules whereby they may be positioned and operated in the manned disclosed in this patent application. The mine vehicles may also provide surveying and monitoring data for a mine control unit MCU. The mine control unit MCU may locate in a control room and may be connected to one or more terminal devices or display units DU for providing the operator information about the current status and for displaying situation reports.

When the fan drilling rig 1b is utilized in tunneling, it may operate in a pilot tunnel and may drill blast holes to walls and a ceiling of the pilot tunnel. After blasting the drill holes the pilot tunnel is enlarged. Two successive drill hole fans define length of a round R. In the face drilling, the face drilling rig 1a drills drill holes to an end surface i.e face of the tunnel 8a. After development excavation, the formed mine spaces may be surveyed by means of the monitoring modules of the mine vehicles. The monitoring module may comprise scanning device for scanning the faces and other surfaces of the tunnels 8a-8d.

The drawings and the related description are only intended to illustrate the idea of the invention. In its details, the invention may vary within the scope of the claims.

The invention claimed is:

1. A mine vehicle comprising:
a movable carrier;
at least one mine work device for executing mine work tasks in a mine;
at least one scanning device for scanning surroundings of the mine vehicle and producing 3D scanning data of the surroundings;
a control unit configured to receive data and process the data in at least one processor, the control unit including at least one point cloud matching program arranged to be executed in the processor;
an initial first point cloud data arranged to be input into the control unit, the first point cloud data including a stored reference 3D model of the mine including point cloud data in a mine coordinate system;
at least one second point cloud data produced by the at least one scanning device of the mine vehicle arranged to be input into the control unit, the second point cloud data including operational scanning data of the current position of the mine vehicle, the control unit being configured to process the second point cloud data by extracting point cloud data of the surrounding surfaces and removing point cloud data of other objects, whereby a simplified second point cloud data of the surrounding surfaces is created, to execute the point cloud matching program in order to match the simplified second point cloud data to the reference first point cloud data, and to determine position and direction of the mine vehicle in the mine coordinate system on the basis of the determined matching between the simplified second point cloud data and the reference first point cloud data;
the control unit including at least one mine work plan defining position of a mine work site in the mine coordinate system and mine work tasks to be executed at the mine work site; and
the control unit is configured to connect the determined position of the mine vehicle and the position of the mine work plan for initiating the mine work task at the mine work site.

2. The mine vehicle as claimed in claim 1, wherein the control unit is configured to determine an area or section of the mine where the mine vehicle is operating, and based on the position data, the control unit is configured to compare the scanned second point cloud data to partial point cloud data of the mine, whereby a dedicated and limited point cloud data is serving as the reference data in the comparison.

3. The mine vehicle as claimed in claim 1, wherein the mine vehicle is a rock drilling rig including at least one drilling boom provided with a drilling unit, the control unit including at least one drilling pattern serving as the mine work plan and defining positions and directions of several drill holes in the mine coordinate system for a round to be drilled at the predetermined drilling position in the mine, the control unit being configured to connect the determined position of the rock drilling rig and the position of the drilling pattern for initiating the drilling at the drilling position.

4. The mine vehicle as claimed in claim 1, wherein the mine vehicle is operable in an excavated rock space having a tunnel line and a realized face in a depth direction of the tunnel line, the mine vehicle including at least one instrumented boom with measuring devices arranged to detect the face and determine a position of the face relative to the tunnel line in depth direction, and wherein the control unit is configured to define the position of the mine work plan on the basis of the determined depth position of the realized face.

5. The mine vehicle as claimed in claim 4, wherein measuring devices are arranged to determine a greatest depth of the tunnel face in the depth direction of the tunnel line, and wherein the control unit is configured to determine the detected greatest depth to define the position of the face.

6. The mine vehicle as claimed in claim 5, wherein the mine work device is located at a distal portion of the instrumented boom, a location of the face relative to the carrier being determined by arranging the mine work device in contact with the face and determining the location of the face by the instrumented boom having the measuring devices.

7. The mine vehicle as claimed in claim 4, wherein the scanning device is arranged to scan towards the realized face, whereby point cloud data provided with coordinates is produced of realized surfaces of previously excavated at least one round, and the control unit is configured to determine properties of the realized surfaces on the basis of the produced point cloud data.

8. The mine vehicle as claimed in claim 4, wherein position and direction of the mine work device is determined by scanning the surroundings of the mine vehicle, whereby point cloud data of the mine work device is created, the at least one control unit being provided with a reference point cloud data of the mine work device, and at least one point cloud processing program arranged to be executed in the at least one control unit for comparing the scanned point cloud data and the reference point cloud data in order to search and detect the mine work device in the scanned point cloud data and to determine position and direction of the mine work device.

9. The mine vehicle as claimed in claim 4, wherein the control unit is configured to compare the point cloud data produced by means of the scanning device with the 3D model of the mine in relation to the detected position and is configured to detect in the scanning data new or changed surrounding point cloud objects at the scanned position allowing newly created or changed walls to be detected and recorded, and the control unit being configured to incorporate the new point cloud data to the point cloud data of the 3D model of the mine, whereby the mine control unit is configured to update the 3D model of the mine on the basis of the scanning data.

10. A control unit for determining position and direction of a mine vehicle provided with at least one scanning device, the control unit comprising:
 a processor arranged in operational communication with the mine vehicle having the at least one scanning device, the processor being arranged to receive from the mine vehicle operational scanning data of the current position of the mine vehicle, the scanning data including operational second point cloud data produced by the at least one scanning device, and for processing the received operational scanning data;
 at least one point cloud matching program arranged to be executed in the processor;
 initial first point cloud data including stored reference 3D model of the mine including point cloud data in a mine coordinate system, the control unit being configured to process the second point cloud data by extracting point cloud data of the surrounding surfaces and removing point cloud data of other objects, whereby a simplified second point cloud data of the surrounding surfaces is being created, to execute the point cloud matching program in order to match the simplified second point cloud data to the reference first point cloud data, and to determine position and direction of the mine vehicle in the mine coordinate system on the basis of the determined matching between the simplified point cloud data and the reference first point cloud data; and
 at least one mine work plan defining position of a mine work site in the mine coordinate system and mine work tasks to be executed at the mine work site, wherein the control unit is configured to connect the determined position of the mine vehicle and the position of the mine work plan for initiating the mine work task at the mine work site.

11. A method of initiating mine work task at a mine work site, the method comprising:
 positioning a mine vehicle in a mine;
 executing at least one operational scanning of the surroundings of the mine vehicle by at least one on-board scanning device of the mine vehicle;
 inputting produced at least one operational point cloud data of the operational scanning of the surroundings to at least one control unit provided with a point cloud matching program;
 inputting point cloud data of a 3D mine model to the control unit and using it as a reference point cloud data of the mine, wherein the reference data includes coordinates of the reference point cloud data in a mine coordinate system;
 processing the operational point cloud data by extracting point cloud data of the surrounding surfaces and removing point cloud data of other objects, wherein a simplified operational point cloud data of the surrounding surfaces is created;
 executing the point cloud matching program in a processor of the control unit for searching matching points between the simplified operational point cloud data and the reference point cloud data;
 utilizing results of the matching process for determining position and direction of the mine vehicle in the mine coordinate system;
 providing the control unit also with at least one mine work plan defining position of a mine work site in the mine coordinate system and mine work tasks to be executed at the mine work site; and
 connecting the determined position of the mine vehicle and the position of the mine work plan for initiating the mine work task at the mine work site.

\* \* \* \* \*